(12) United States Patent
Ko et al.

(10) Patent No.: US 12,092,700 B2
(45) Date of Patent: Sep. 17, 2024

(54) INTERACTIVE TEST EQUIPMENT FOR QUALITY EVALUATION OF RESISTANCE VALUE TEST FOR ELECTRIC LEAKAGE

(71) Applicant: Po-Cheng Ko, Taichung (TW)

(72) Inventors: Po-Cheng Ko, Taichung (TW); Chun-Yao Ko, Taichung (TW); Chih-Ting Ko, Taichung (TW)

(73) Assignee: Po-Cheng Ko, Taichung (TW)

( * ) Notice: Subject to any disclaimer, the term of this patent is extended or adjusted under 35 U.S.C. 154(b) by 181 days.

(21) Appl. No.: 17/931,909

(22) Filed: Sep. 14, 2022

(65) Prior Publication Data

US 2023/0108966 A1 Apr. 6, 2023

(30) Foreign Application Priority Data

Oct. 4, 2021 (TW) .................................. 110136917

(51) Int. Cl.
*G01R 31/52* (2020.01)
*G01R 31/327* (2006.01)

(52) U.S. Cl.
CPC ........... *G01R 31/52* (2020.01); *G01R 31/327* (2013.01)

(58) Field of Classification Search
CPC ... G01R 31/52; G01R 31/327; G01R 31/3277
See application file for complete search history.

(56) References Cited

U.S. PATENT DOCUMENTS

| 2003/0172332 | A1* | 9/2003 | Rearick | G01R 31/3004 714/724 |
|---|---|---|---|---|
| 2005/0243484 | A1* | 11/2005 | Kim | H02H 3/335 361/42 |
| 2013/0314099 | A1* | 11/2013 | Ko | G01R 31/52 324/510 |
| 2018/0004944 | A1* | 1/2018 | Nagata | H01L 27/04 |

* cited by examiner

*Primary Examiner* — Dominic E Hawkins
(74) *Attorney, Agent, or Firm* — Cheng-Ju Chiang (57) ABSTRACT

An interactive test equipment for quality evaluation of resistance value test for electric leakage is disposed on a platform, and includes at least a control unit, a leaking electric current control module and an operating module. The leaking electric current control module includes at least a test set for quality evaluation to determine a resistance value for electric leakage. Each of the at least a test set has a circuit breaker and an electric leakage value display. The electric leakage value display of the each of the at least a test set can be used to display tripping circuit-breaking data of a corresponding circuit breaker. Test subjects can initiate the interactive test equipment and select answers through the operating module, and load questions and determine answers through the control unit.

7 Claims, 5 Drawing Sheets

INTERACTIVE TEST EQUIPMENT FOR QUALITY EVALUATION OF RESISTANCE VALUE TEST FOR ELECTRIC LEAKAGE

BACKGROUND OF THE INVENTION

Field of the Invention

The present invention relates to a test technical field of power using safety education, particularly relates to an interactive test equipment for quality evaluation of resistance value test for electric leakage. The interactive test equipment in accordance with the present invention is used to allow processing quality evaluation of resistance values of a circuit breaker with electric leakage through an interactive test method, and then to authenticate and evaluate a judgment ability of the test subjects in order for ensuring that the test subjects can immediately find out whether the circuit breaker with electric leakage is normal in real time when the test subjects work in a construction site.

Description of Related Art

In various construction sites or large hypermarkets, department stores, buildings, etc., due to different equipment specifications and functions, voltages used therein are not exactly the same. As a result, a variety of power sources, such as a three-phase voltage of 380V, a three-phase voltage of 220V, a single-phase voltage of 220V or an ordinary voltage of 110V, etc., are usually equipped. Due to influence of different factors such as expiration of a service life, aging of electric contact points, moisture or wire biting from insets or mice, etc., situations of electric leakage may happen. Once a phenomenon of electric current leakage happens, not only energy waste is caused and related electrical equipment is damaged, but also safety for human bodies and properties of peripheral personnel is even endangered.

In order to avoid danger induced from the above mentioned phenomenon of electric leakage, leakage circuit breakers are usually installed at power supplying contact points and used to trip immediately in real time when electric leakage occurs so as to prevent accidents of electric shock. Therefore, entire safety of power usage is directly affected whether or not the leakage circuit breakers are normally operated. Hence, during an electric power inspection process, factory personnel need to regularly or irregularly check whether a resistance value of the leakage circuit breakers is normal. As a result, ability of the factory personnel to process quality evaluation of leakage resistance values under testing will also become very important. As mentioned above, voltages for power supply are commonly set as a three-phase voltage of 380V, a three-phase voltage of 220V, a single-phase voltage of 220V and a single-phase voltage of 110V, and they are corresponded to different electric currents such as 10 mA, 15 mA or 30 mA according to energy consumption of power using equipment. As a result, a leakage resistance value of a corresponding leakage circuit breaker is also different. The factory personnel are required to immediately process quality evaluation of leakage circuit breakers based on leakage resistance values in real time so as to ensure safety of electricity use.

Therefore, in order to ensure that workers can immediately determine testing quality of leakage resistance values of all kinds of leakage circuit breakers with a variety of voltages and electric currents, it is necessary to arrange regular or irregular return training and testing for the workers to ensure that they have a good judgment ability. However, existing test methods are proceeded for testing based on edited test papers or preset leakage circuit breakers. Questions thereof are monotonous and their answers are fixed. As a result, tests based on them are not interactive and realistic. Taking tests becomes a superficial operation for the workers. Actual judgment ability of the workers for quality evaluation of leakage resistance values cannot be effectively understood.

In other words, a solution how to overcome shortcomings of the existing methods to use fixed test papers or circuit breakers with electric leakage for testing, and how to make tests become more variable and interactive to have a reality simulation effect is highly expected by the related industry and is also intended to be researched through the present invention.

Hence, the inventors of the present invention deeply research problem of existing resistance value tests for electric leakage. Based on many years of rich experience in research, development and manufacture in the related industry and after continuous hard working and effort of research and trial production, an interactive test equipment for quality evaluation of resistance value test for electric leakage in accordance with the present invention is finally successfully developed to overcome trouble and inconvenience caused by deficiency of variety and interaction in the existing art.

BRIEF SUMMARY OF THE INVENTION

Accordingly, a main objective of the present invention is to provide an interactive test equipment for quality evaluation of resistance value test for electric leakage. The interactive test equipment in accordance with the present invention is used to allow test subjects processing quality evaluation of resistance values of circuit breakers with electric leakage through an interactive test method, and then to authenticate and evaluate a judgment ability of the test subjects.

In addition, another main objective of the present invention is to provide an interactive test equipment for quality evaluation of resistance value test for electric leakage. The interactive test equipment in accordance with the present invention is used to ensure that the test subjects can instantly find out in time whether a circuit breaker with electric leakage has a normal ability to work when they work in a construction site so as to ensure safety of a working environment.

Based on the above, the above mentioned objectives and effects of the present invention are physically fulfilled mainly through the following technical solutions. The interactive test equipment is disposed on a platform, and includes at least a control unit, a leaking electric current control module and an operating module.

The control unit is disposed to have data or instructions for processing the leaking electric current control module and the operating module. The leaking electric current control module is signally connected with the control unit. The leaking electric current control module includes at least a test set for quality evaluation to determine a resistance value for electric leakage. Each of the at least a test set has a circuit breaker and an electric leakage value display. Besides, the each of the at least a test set can be applied with different voltages and electric leakage values. Moreover, the electric leakage value display of the each of the at least a test set can be used to display tripping circuit-breaking data of the corresponding circuit breaker.

The operating module is signally connected with the control unit. The operating module includes at least an answer selecting switch set corresponding to the at least a test set. Each of the at least an answer selecting switch set has a normal switch and an abnormal switch. The operating module includes an initiating switch acting to start tests in the interactive test equipment. In addition, the operating module includes an adjusting set for adjusting data of leaking electric currents. The adjusting set includes a raising switch and a lowering switch for adjusting leaking electric currents. Moreover, the operating module includes a result judgment set. The result judgment set includes a result switch to initiate the interactive test equipment summarizing test results, a pass light and a fail light.

The control unit is electrically connected with a power source to supply power to the interactive test equipment.

Accordingly, through physically fulfilling the above technical solutions, the interactive test equipment for quality evaluation of resistance value test for electric leakage in accordance with the present invention can be used to allow test subjects proceeding quality evaluation of resistance values for electric leakage through an interactive test method, and then to authenticate and evaluate a judgment ability of the test subjects in order for ensuring that the test subjects can instantly find out in real time whether circuit breakers with electric leakage are normal when they work in a construction site so as to ensure safety of a working environment. As a result, practicality of the interactive test equipment can be effectively enhanced, added values of related products can be increased, and economic benefits of the interactive test equipment can be promoted.

Besides, the above objectives and effects of the present invention are further achieved through the following exemplified technical solution.

The leaking electric current control module includes eight test sets, including a test set with a three-phase voltage of 380V (3ψ380V) and an electric current of 15 mA, a test set with a three-phase voltage of 380V (3ψ380V) and an electric current of 30 mA, a test set with a three-phase voltage of 220V (3ψ220V) and an electric current of 15 mA, a test set with a three-phase voltage of 220V (3ψ220V) and an electric current of 30 mA, a test set with a single-phase voltage of 220V (1ψ220V) and an electric current of 15 mA, a test set with a single-phase voltage of 220V (1ψ220V) and an electric current of 30 mA, a test set with a single-phase voltage of 110V (1ψ110V) and an electric current of 15 mA and a test set with a single-phase voltage of 110V (1ψ110V) and an electric current of 30 mA.

The normal switch, the abnormal switch, the initiating switch, the result switch, the raising switch and the lowering switch of the operating module can be buttons.

An indicating light set is respectively disposed beside each of the at least an answer selecting switch set of the operating module. The indicating light set includes a normal light and an abnormal light respectively corresponding to the normal switch and the abnormal switch.

An action light is respectively disposed beside the initiating switch of the operating module.

An adjusting light set is respectively disposed beside the adjusting set of the operating module. The adjusting light set includes a raising light and a lowering light respectively corresponding to the raising switch and the lowering switch.

The control unit can be signally connected with a voice module in order to output reminding or alerting sounds or voices.

In order to enable the honorable Examiner to further understand constitutions, features and other objectives of the present invention, the following is exemplified to show several preferred embodiments of the present invention, and detailed descriptions thereof are provided hereinafter in cooperation with the drawings. At the same time, those who are familiar with the same technical field can physically practice the present invention accordingly.

DETAILED DESCRIPTION OF THE INVENTION

The present invention is related to an interactive test equipment for quality evaluation of resistance value test for electric leakage. The following illustrations based on specified physical embodiments of the present invention are used to illustrate technical contents of the present invention so that the ordinarily skilled in the art can easily understand advantages and efficacy according to illustrated contents in the specification. Besides, the present invention can also be implemented or applied according to other different physical embodiments. In physical embodiments and components therein in accordance with the present invention illustrated in accompanying drawings, all references regarding designated sizes, front and back, left and right, a top portion and a bottom portion, an upper portion and a lower portion and a horizontal direction and a vertical direction are only used for convenient illustrations, and are not used to limit the present invention or limit components of the present invention in any position or spatial direction. The present invention can be varied according to designs and requirements of physical embodiments of the present invention without departing from the claimed scope of the present invention.

Figure 1:
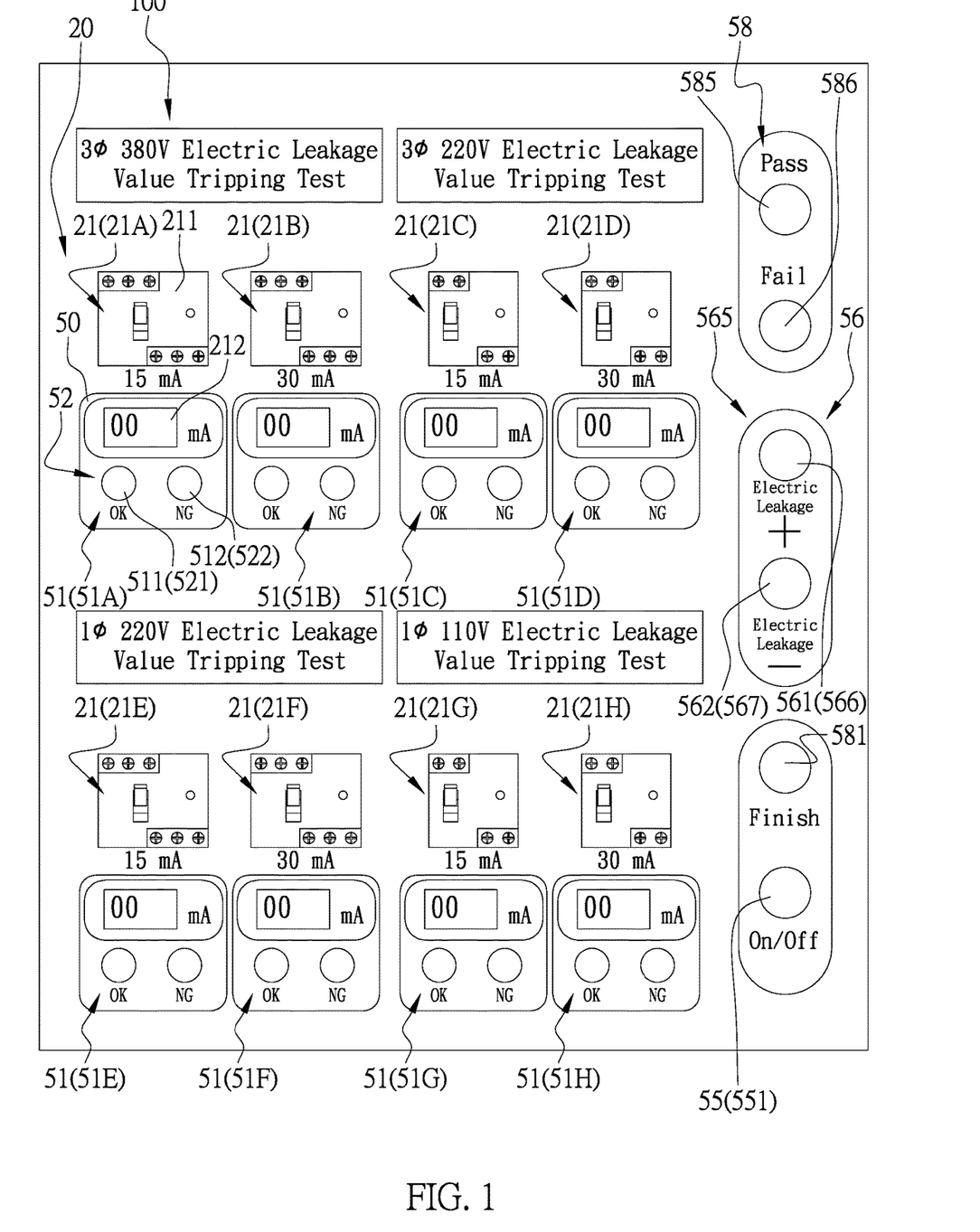
FIG. 1 shows a schematic test panel structural diagram of an interactive test equipment for quality evaluation of resistance value test for electric leakage in accordance with a preferred embodiment of the present invention to illustrate a configuration of the interactive test equipment and an application thereof in tests in a using status of the interactive test equipment.
Figure 2:
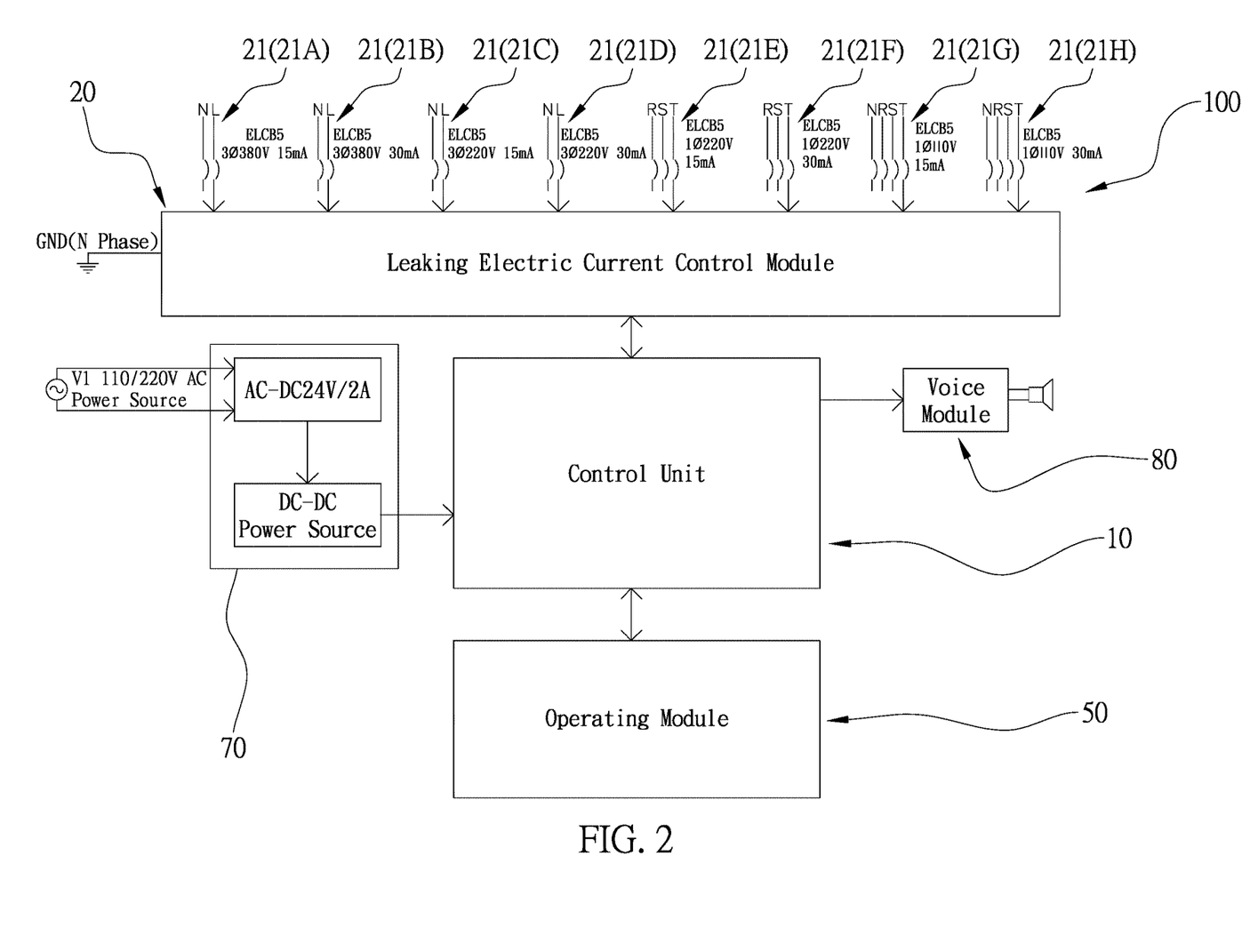
FIG. 2 shows a schematic circuit configuration diagram of the interactive test equipment for quality evaluation of resistance value test for electric leakage in accordance with a preferred embodiment of the present invention.
Figure 3:
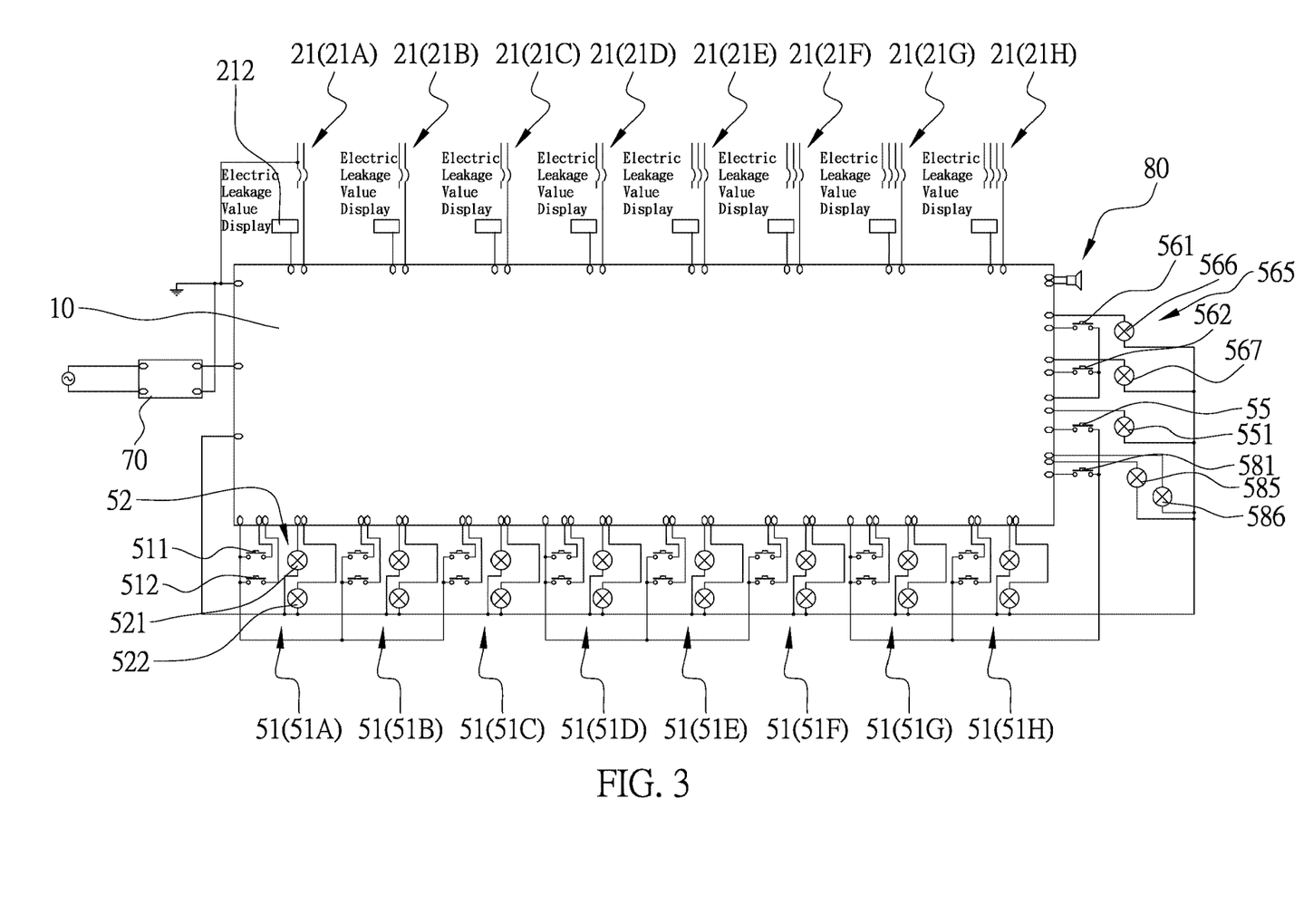
FIG. 3 shows a schematic wiring configuration diagram of a control unit of the interactive test equipment for quality evaluation of resistance value test for electric leakage in accordance with a preferred embodiment of the present invention.

Referring to FIGS. 1-3, a structure of an interactive test equipment for quality evaluation of resistance value test for electric leakage in accordance with the present invention is provided and shown. The interactive test equipment is disposed on a platform 100 to include at least a control unit 10, a leaking electric current control module 20 and an operating module 50.

The control unit 10 is disposed to have data or instructions for processing the leaking electric current control module 20 and the operating module 50. The leaking electric current control module 20 is signally connected with the control unit 10. The leaking electric current control module 20 includes at least a test set 21 for quality evaluation to determine a resistance value for electric leakage. Each of the at least a test set 21 has a circuit breaker 211 and an electric leakage value display 212. Besides, the each of the at least a test set 21 can be applied with different voltages and electric leakage values. For example, eight test sets 21 are disposed in a main embodiment in accordance with the present invention. The eight test sets 21 include a test set 21A with a three-phase voltage of 380V (3ψ380V) and an electric current of 15 mA, a test set 21B with a three-phase voltage of 380V (3ψ380V) and an electric current of 30 mA, a test set 21C with a three-phase voltage of 220V (3ψ220V) and an electric current of 15 mA, a test set 21D with a three-phase voltage of 220V (3ψ220V) and an electric current of 30 mA, a test set 21E with a single-phase voltage of 220V (1ψ220V) and an electric current of 15 mA, a test set 21F with a single-phase voltage of 220V (1φ220V) and an electric current of 30 mA, a test set 21G with a single-phase voltage of 110V (1φ110V) and an electric current of 15 mA and a test set 21H with a single-phase voltage of 110V (1φ110V) and an electric current of 30 mA. Furthermore, the electric leakage value display 212 (i.e., 212A to 212H) of the each of the at least a test set 21 (i.e., 21A to 21H) can be used to display tripping circuit-breaking data of the corresponding circuit breaker 211 (i.e., 211A to 211H).

The operating module 50 is signally connected with the control unit 10. The operating module 50 includes at least an answer selecting switch set 51 corresponding to the at least a test set 21. Each of the at least an answer selecting switch set 51 has a normal switch 511 and an abnormal switch 512. The normal switch 511 and the abnormal switch 512 can be buttons. Eight answer selecting switch sets 51 (i.e., 51A to 51H) corresponding to the eight test sets 21 (i.e., 21A to 21H) are disposed in a main embodiment in accordance with the present invention. Each of the eight answer selecting switch sets 51 is used for the test subjects to select answers via the normal switch 511 or the abnormal switch 512 based on tripping electric leakage values of a corresponding circuit breaker 211 displayed by an electric leakage value display 212 of a corresponding one of the eight test sets 21. According to some embodiments in accordance with the present invention, an indicating light set 52 is respectively disposed beside each of the at least an answer selecting switch set 51. The indicating light set 52 includes a normal light 521 and an abnormal light 522 respectively corresponding to the normal switch 511 and the abnormal switch 512 in order to display answers selected by the test subjects for facilitating confirmation from the test subjects and test supervisors. The operating module 50 includes an initiating switch 55 acting to start tests in the interactive test equipment. The initiating switch 55 can be a button. Further according to some embodiments in accordance with the present invention, an action light 551 is respectively disposed beside the initiating switch 55. The action light 551 is used to display the interactive test equipment is electrified to be initiated, and tests taken by the test subjects can be started. In addition, the operating module 50 further includes an adjusting set 56 for adjusting data of leaking electric currents. The adjusting set 56 includes a raising switch 561 and a lowering switch 562. The raising switch 561 and the lowering switch 562 can respectively be a button for adjusting the data of leaking electric currents. Further according to some embodiments in accordance with the present invention, an adjusting light set 565 is respectively disposed beside the adjusting set 56. The adjusting light set 565 includes a raising light 566 and a lowering light 567 respectively corresponding to the raising switch 561 and the lowering switch 562 in order to display actions of adjusting leaking electric currents. Moreover, the operating module 50 further includes a result judgment set 58. The result judgment set 58 includes a result switch 581 to initiate the interactive test equipment summarizing test results, a pass light 585 and a fail light 586. The result switch 581 can be a button.

In addition, the control unit 10 is electrically connected with a power source 70 to supply power to the interactive test equipment. According to some embodiments in accordance with the present invention, the control unit 10 is further signally connected with a voice module 80 in order to output reminding or alerting sounds or voices.

Accordingly, the interactive test equipment for quality evaluation of resistance value test for electric leakage in accordance with the present invention is constituted to allow test subjects proceeding their judgment regarding leaking electric currents through the interactive test equipment.

Figure 4:
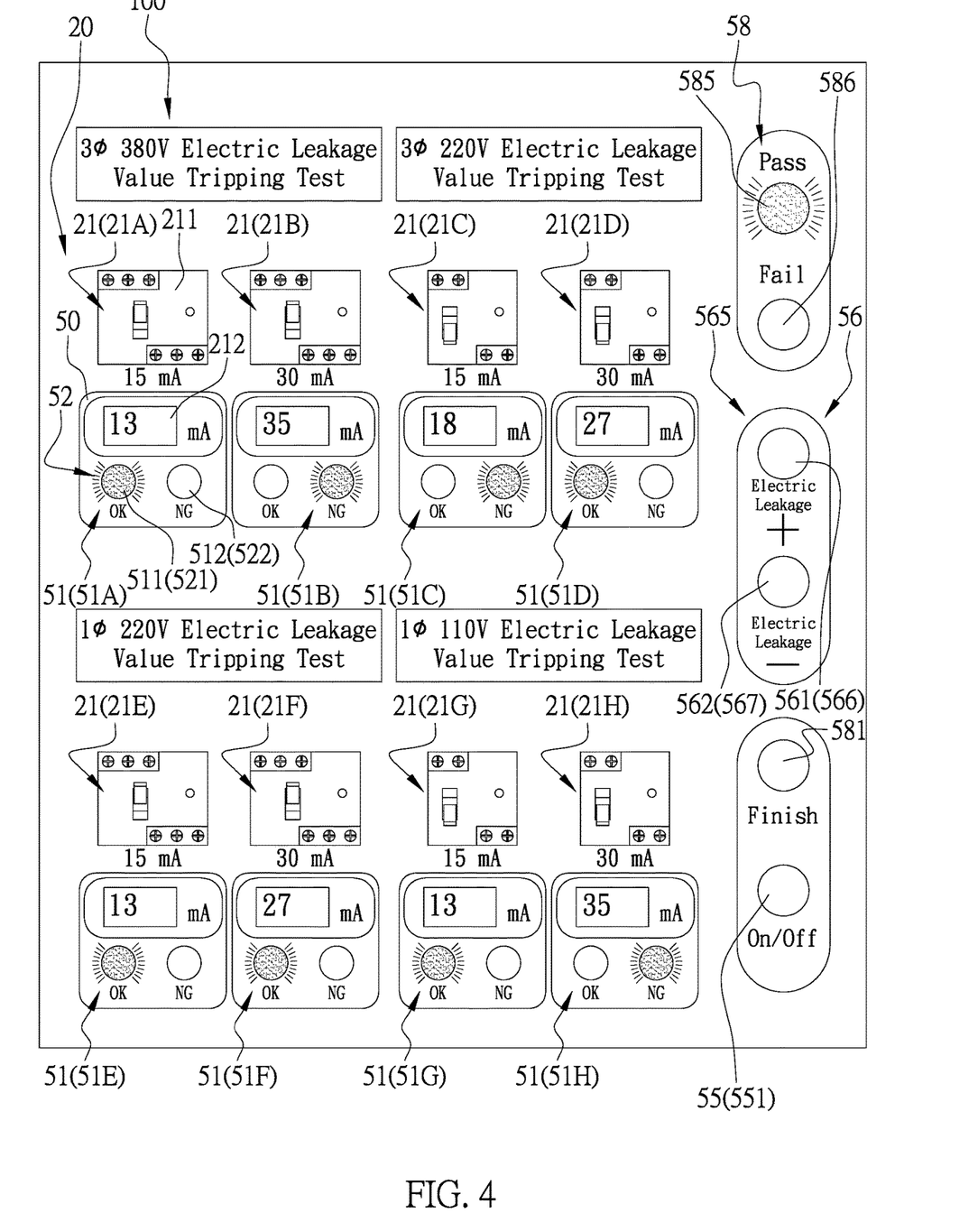
FIG. 4 shows a schematic using status diagram of the interactive test equipment for quality evaluation of resistance value test for electric leakage in accordance with a preferred embodiment of the present invention to illustrate an actual using status during a test.
Figure 5:
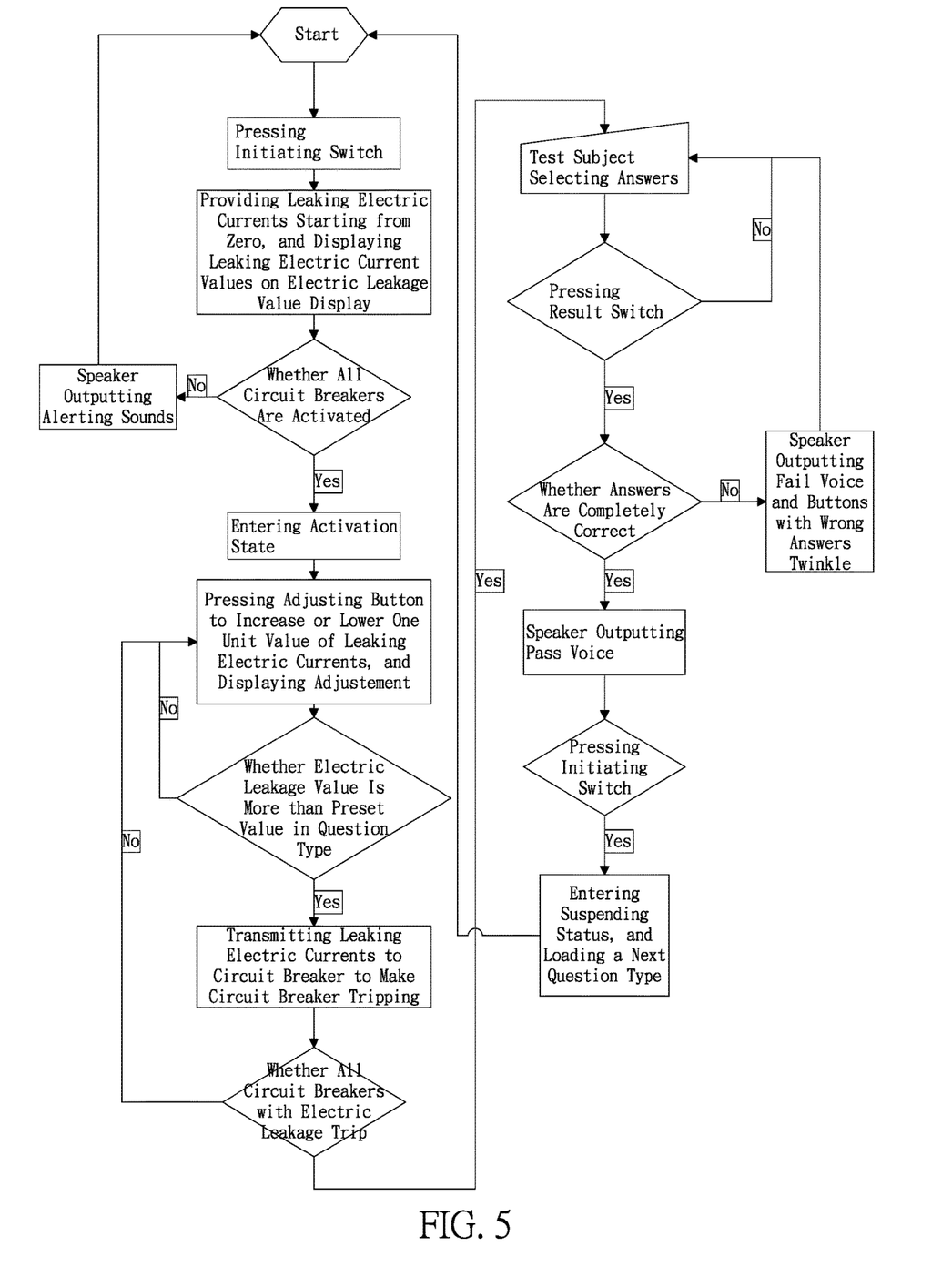
FIG. 5 shows a schematic test flow chart diagram of the interactive test equipment for quality evaluation of resistance value test for electric leakage in accordance with a preferred embodiment of the present invention to illustrate testing steps.

Referring to FIGS. 4-5, actual test steps and processes for the interactive test equipment for quality evaluation of resistance value test for electric leakage in accordance with the present invention are shown. In practice, a test subject presses the initiating switch 55 of the operating module 50 to power the interactive test equipment and to prepare the interactive test equipment being ready for the test subject so that the test subject can proceed through the interactive test equipment to evaluate a resistance value for electric leakage of the circuit breaker 211 in the each of the at least a test set 21 of the leaking electric current control module 20. Besides, the electric leakage value display 212 disposed beside the circuit breaker 211 in the each of the at least a test set 21 of the leaking electric current control module 20 displays leaking electric currents starting from a value of "0". The circuit breaker 211 in the each of the at least a test set 21 (i.e., 21A to 21H) is then determined whether the circuit breaker 211 in the each of the at least a test set 21 (i.e., 21A to 21H) is activated. If any of the at least a test set 21 (i.e., 21A to 21H) is not activated, the voice module 80 outputs alerting sounds, and the interactive test equipment restores to an initial state of inactivation. On the contrary, if every circuit breaker 211 in the at least a test set 21 (i.e., 21A to 21H) is activated, the interactive test equipment enters an activation state.

Subsequently, the raising switch 561 or the lowering switch 562 of the adjusting set 56 of the operating module 50 is pressed to adjust for increasing or lowering a test leaking electric current value. The test leaking electric current value is simultaneously displayed on a corresponding electric leakage value display 212 in the at least a test set 21 (i.e., 21A to 21H). When the test leaking electric current value is not more than a preset circuit-breaking value of either one circuit breaker 211 in the at least a test set 21 (i.e., 21A to 21H, for example, the test set(s) 21 such as the test set 21B, the test set 21E, the test set 21F and the test set 21G), the raising switch 561 of the adjusting set 56 can be continuously pressed to increase the test leaking electric current value. On the contrary, if the test leaking electric current value is more than the preset circuit-breaking value of the either one circuit breaker 211 in the corresponding one of the at least a test set 21 (i.e., 21A to 21H), the either one circuit breaker 211 in the at least a test set 21 (i.e., 21A to 21H) trips (Such as the test set 21A, the test set 21C, the test set 21D and the test set 21H). In the meantime, the electric leakage value display 212 in the corresponding one of the at least a test set 21 (i.e., 21A to 21H) displays and stays as a circuit-breaking value which is displayed when the either one circuit breaker 211 in the at least a test set 21 (i.e., 21A to 21H) trips. Before every circuit breaker 211 in the at least a test set 21 (i.e., 21A to 21H) trips, the raising switch 561 of the adjusting set 56 is continuously pressed.

When every circuit breaker 211 in every of the at least a test set 21 (i.e., 21A to 21H) trips, the test subject proceeds to select answers through the interactive test equipment. The test subject determines whether a circuit breaker 211 is in a good or poor condition based on a preset value of leaking electric currents (i.e., the preset circuit-breaking value as above mentioned) of the circuit breaker 211 in the at least a test set 21 (i.e., 21A to 21H) and a value of leaking electric currents (i.e., the circuit-breaking value as above mentioned) displayed on a corresponding electric leakage value display 212. The test subject also presses the answer selecting switch sets 51 (i.e., 51A to 51H) of the operating module 50 corresponding to the test sets 21 (i.e., 21A to 21H) based on the determined answers, i.e., presses a corresponding normal switch 511 or abnormal switch 512 of the answer selecting switch sets 51 (i.e., 51A to 51H) based on the determined answers. Afterwards, the result switch 581 of the operating module 50 is pressed by the test subject. When the control unit 10 determines answers selected by the test subject on the answer selecting switch sets 51 (i.e., 51A to 51H) for all of the test sets 21 (i.e., 21A to 21H) are not completely correct, the voice module 80 outputs a fail voice, and the indicating light set 52 of the answer selecting switch sets 51 (i.e., 51A to 51H) for every one of the test sets 21 (i.e., 21A to 21H) with a wrong answer on the circuit breaker 211 in the at least a test set 21 (i.e., 21A to 21H) thereof twinkles. The test subject retakes the test and answers based on the above method and steps.

On the contrary, when the control unit 10 determines answers selected by the test subject on the answer selecting switch sets 51 (i.e., 51A to 51H) for all of the test sets 21 (i.e., 21A to 21H) are completely correct, the voice module 80 outputs a pass voice, and the initiating switch 55 can be pressed again so that the interactive test equipment enters a suspending status. After the control unit 10 loads a next question type for all of the test sets 21 (i.e., 21A to 21H) of the leaking electric current control module 20, the test of quality evaluation of resistance value test for electric leakage for different test subjects can be repeatedly proceeded.

Based on the above illustrations, the interactive test equipment for quality evaluation of resistance value test for electric leakage in accordance with the present invention is disposed on the platform 100 to include the at least a control unit 10, the leaking electric current control module 20 and the operating module 50, and the at least a control unit 10, the leaking electric current control module 20 and the operating module 50 are signally connected. The leaking electric current control module 20 includes at least a test set 21 to determine resistance values of electric leakage, and each of the at least a test set 21 has the circuit breaker 211 and the electric leakage value display 212. Based on the above design, the electric leakage value display 212 (i.e., 212A to 212H) can display tripping circuit-breaking data of a corresponding circuit breaker 211 (i.e., 211A to 211H). Test subjects can initiate the interactive test equipment and select answers through the operating module 50, and load questions and determine answers through the control unit 10. As a result, the interactive test equipment is used to allow test subjects processing quality evaluation of resistance values of the circuit breaker 211 (i.e., 211A to 211H) with electric leakage through an interactive test method, and then to authenticate and evaluate a judgment ability of the test subjects in order to ensure safety of a working environment.

Accordingly, it can be understood that the present invention is an extremely creative invention. In addition to effectively solving problems faced by the ordinarily skilled in the art, the present invention is also configured to greatly improve efficacy. Besides, no identical or similar product in the same technical field can be found to be invented or in public use, and the present invention has enhanced advantages simultaneously. Therefore, the present invention meets requirements of "novelty" and "non-obviousness" as stipulated for utility patent applications in the patent law, and a patent application for the present invention is filed in accordance with the patent law.

What is claimed is:

1. An interactive test equipment for quality evaluation of resistance value test for electric leakage, being disposed on a platform, and comprising at least a control unit, a leaking electric current control module and an operating module; wherein the control unit is disposed to comprise data or instructions for processing the leaking electric current control module and the operating module, the leaking electric current control module is signally connected with the control unit, and the leaking electric current control module comprises at least a test set for quality evaluation to determine a resistance value for electric leakage, each of the at least a test set comprises a circuit breaker and an electric leakage value display, the each of the at least a test set is applied with different voltages and electric leakage values, the electric leakage value display of the each of the at least a test set is used to display tripping circuit-breaking data of the corresponding circuit breaker of the each of the at least a test set;

the operating module is signally connected with the control unit, the operating module comprises at least an answer selecting switch set corresponding to the at least a test set, each of the at least an answer selecting switch set comprises a normal switch and an abnormal switch, the operating module comprises an initiating switch acting to start tests in the interactive test equipment, the operating module further comprises an adjusting set for adjusting data of leaking electric currents, the adjusting set comprises a raising switch and a lowering switch for adjusting leaking electric currents, the operating module comprises a result judgment set, the result judgment set comprises a result switch to initiate the interactive test equipment summarizing test results, a pass light and a fail light;

the control unit is electrically connected with a power source to supply power to the interactive test equipment;

the interactive test equipment for quality evaluation of resistance value test for electric leakage is constituted to allow test subjects proceeding judgment thereof for leaking electric currents through the interactive test equipment.

2. The interactive test equipment for quality evaluation of resistance value test for electric leakage as claimed in claim 1, wherein the leaking electric current control module comprises eight test sets, comprising a test set with a three-phase voltage of 380V (3ψ380V) and an electric current of 15 mA, a test set with a three-phase voltage of 380V (3ψ380V) and an electric current of 30 mA, a test set with a three-phase voltage of 220V (3ψ220V) and an electric current of 15 mA, a test set with a three-phase voltage of 220V (3ψ220V) and an electric current of 30 mA, a test set with a single-phase voltage of 220V (1ψ220V) and an electric current of 15 mA, a test set with a single-phase voltage of 220V (1φ220V) and an electric current of 30 mA, a test set with a single-phase voltage of 110V (1φ110V) and an electric current of 15 mA and a test set with a single-phase voltage of 110V (1φ110V) and an electric current of 30 mA.

3. The interactive test equipment for quality evaluation of resistance value test for electric leakage as claimed in claim 1, wherein the normal switch, the abnormal switch, the initiating switch, the result switch, the raising switch and the lowering switch of the operating module are respectively buttons.

4. The interactive test equipment for quality evaluation of resistance value test for electric leakage as claimed in claim 1, wherein an indicating light set is respectively disposed beside each of the at least an answer selecting switch set of the operating module, the indicating light set comprises a normal light and an abnormal light respectively corresponding to the normal switch and the abnormal switch.

5. The interactive test equipment for quality evaluation of resistance value test for electric leakage as claimed in claim 1, wherein an action light is respectively disposed beside the initiating switch of the operating module.

6. The interactive test equipment for quality evaluation of resistance value test for electric leakage as claimed in claim 1, wherein an adjusting light set is respectively disposed beside the adjusting set of the operating module, the adjusting light set comprises a raising light and a lowering light respectively corresponding to the raising switch and the lowering switch.

7. The interactive test equipment for quality evaluation of resistance value test for electric leakage as claimed in claim 1, wherein the control unit is signally connected with a voice module in order to output reminding or alerting sounds or voices.

* * * * *